(12) United States Patent
Rouse et al.

(10) Patent No.: US 11,114,602 B2
(45) Date of Patent: *Sep. 7, 2021

(54) METHOD OF FORMING SUPERCONDUCTING LAYERS AND TRACES

(71) Applicant: Microsoft Technology Licensing, LLC, Redmond, WA (US)

(72) Inventors: Richard P. Rouse, Bellevue, WA (US); David B. Tuckerman, Lafayette, CA (US)

(73) Assignee: Microsoft Technology Licensing, LLC, Remond, WA (US)

( * ) Notice: Subject to any disclaimer, the term of this patent is extended or adjusted under 35 U.S.C. 154(b) by 0 days.

This patent is subject to a terminal disclaimer.

(21) Appl. No.: 16/842,431

(22) Filed: Apr. 7, 2020

(65) Prior Publication Data

US 2020/0243743 A1    Jul. 30, 2020

Related U.S. Application Data

(63) Continuation of application No. 15/715,521, filed on Sep. 26, 2017, now Pat. No. 10,651,362.

(51) Int. Cl.
*H01L 39/24*     (2006.01)
*H01L 39/12*     (2006.01)
(Continued)

(52) U.S. Cl.
CPC .... *H01L 39/2467* (2013.01); *H01L 21/76828* (2013.01); *H01L 21/76891* (2013.01); *H01L 23/49888* (2013.01); *H01L 23/53285* (2013.01); *H01L 39/025* (2013.01); *H01L 39/128* (2013.01); *H01L 39/2406* (2013.01);
(Continued)

(58) Field of Classification Search
USPC .............................................. 426/62; 427/62
See application file for complete search history.

(56) References Cited

U.S. PATENT DOCUMENTS

| | | | | |
|---|---|---|---|---|
| 4,954,480 A | * | 9/1990 | Imanaka | ........... H01L 21/76891 505/220 |
| 5,930,674 A | * | 7/1999 | Tottori | .............. H01L 21/76801 438/646 |

(Continued)

*Primary Examiner* — Brian K Talbot
(74) *Attorney, Agent, or Firm* — Ranjeev Singh; Singh Law, PLLC

(57) ABSTRACT

Methods and structures corresponding to superconducting apparatus including superconducting layers and traces are provided. A method for forming a superconducting apparatus includes forming a first dielectric layer on a substrate by depositing a first dielectric material on the substrate and curing the first dielectric material at a first temperature. The method further includes forming a first superconducting layer comprising a first set of patterned superconducting traces on the first dielectric layer. The method further includes forming a second dielectric layer on the first superconducting layer by depositing a second dielectric material on the first superconducting layer and curing the second dielectric material at a second temperature, where the second temperature is lower than the first temperature. The method further includes forming a second superconducting layer comprising a second set of patterned superconducting traces on the second dielectric layer.

20 Claims, 4 Drawing Sheets

(51) Int. Cl.
  *H01L 39/02*  (2006.01)
  *H01L 23/498*  (2006.01)
  *H01L 21/768*  (2006.01)
  *H01L 23/532*  (2006.01)
  *H01L 21/48*  (2006.01)
  *H05K 3/46*  (2006.01)
  *B82Y 10/00*  (2011.01)
  *B05D 1/00*  (2006.01)
  *B05D 5/12*  (2006.01)
  *B05D 7/00*  (2006.01)
  *B82Y 40/00*  (2011.01)

(52) U.S. Cl.
  CPC .......... *H01L 39/2487* (2013.01); *B05D 1/005* (2013.01); *B05D 5/12* (2013.01); *B05D 7/50* (2013.01); *B82Y 10/00* (2013.01); *B82Y 40/00* (2013.01); *H01L 21/4857* (2013.01); *H01L 23/49822* (2013.01); *H01L 39/2493* (2013.01); *H05K 3/4605* (2013.01); *H05K 3/467* (2013.01); *H05K 2201/10378* (2013.01)

(56) References Cited

U.S. PATENT DOCUMENTS

| | | | | |
|---|---|---|---|---|
| 6,060,664 | A * | 5/2000 | Tanahashi | H01L 23/53285 174/125.1 |
| 6,420,251 | B1 * | 7/2002 | Elmadjian | H01L 21/76801 257/E21.259 |
| 8,735,326 | B2 * | 5/2014 | Folk | H01L 39/2493 505/410 |
| 9,653,398 | B1 * | 5/2017 | Kelliher | H01L 39/2406 |
| 10,651,362 | B2 * | 5/2020 | Rouse | H01L 21/76828 |
| 2015/0119252 | A1 * | 4/2015 | Ladizinsky | H01L 39/22 505/170 |
| 2018/0219150 | A1 * | 8/2018 | Lanting | H01L 23/53285 |

* cited by examiner

METHOD OF FORMING SUPERCONDUCTING LAYERS AND TRACES

This application is a continuation of U.S. application Ser. No. 15/715,521, entitled "Superconducting Apparatus Including Superconducting Layers and Traces" filed on Sep. 26, 2017, the disclosure of which is incorporated herein in its entirety by reference.

BACKGROUND

Semiconductor based integrated circuits used in electronic devices, such as digital processors, include digital circuits based on complimentary metal-oxide semiconductor (CMOS) technology. CMOS technology, however, is reaching its limits in terms of the device size. In addition, power consumption at high clock speeds by digital circuits based on the CMOS technology has increasingly become a limiting factor in high performance digital circuits and systems.

As an example, servers in a data center are increasingly consuming large amounts of power. The consumption of power is partly the result of power loss from the dissipation of energy even when the CMOS circuits are inactive. This is because even when such circuits are inactive, and are not consuming any dynamic power, they still consume power because of the need to maintain the state of CMOS transistors. In addition, because CMOS circuits are powered using DC voltage there is a certain amount of current leakage even when the CMOS circuits are inactive. Thus, even when such circuits are not processing information, certain amount of power is wasted not only as a result of the requirement to maintain the state of the CMOS transistors, but also as a result of the current leakage.

An additional approach to the use of processors and related components, based on CMOS technology, is the use of superconducting logic based apparatuses and devices. Superconducting logic based apparatuses and devices can also be used to process quantum information, such as qubits.

SUMMARY

In one example, the present disclosure relates to a method comprising forming a first dielectric layer on a substrate by depositing a first dielectric material on the substrate and curing the first dielectric material at a first temperature. The method may further include forming a first superconducting layer comprising a first set of patterned superconducting traces on the first dielectric layer. The method may further include forming a second dielectric layer on the first superconducting layer by depositing a second dielectric material on the first superconducting layer and curing the second dielectric material at a second temperature, where the second temperature is lower than the first temperature. The method may further include forming a second superconducting layer comprising a second set of patterned superconducting traces on the second dielectric layer.

In another aspect, the present disclosure relates to a method comprising forming a first dielectric layer on a substrate by depositing a first dielectric material on the substrate and curing the first dielectric material at a first temperature. The method may further include forming a first niobium layer comprising a first set of patterned niobium traces on the first dielectric layer. The method may further include forming a second dielectric layer on the first niobium layer by depositing a second dielectric material on the first niobium layer and curing the second dielectric material at a second temperature, where the second temperature is approximately equal to or lower than the first temperature by at least 25 degrees Centigrade. The method may further include forming a second niobium layer comprising a second set of patterned niobium traces on the second dielectric layer.

In yet another aspect, the present disclosure relates to a method comprising forming a first dielectric layer on a substrate by spinning on polyimide on the substrate and curing the polyimide at a first temperature. The method may further include forming a first niobium layer comprising a first set of patterned niobium traces on the first dielectric layer. The method may further include forming a second dielectric layer on the first niobium layer by spinning on photo-imageable polyimide on the first niobium layer and curing the photo-imageable polyimide at a second temperature, where the second temperature is lower than the first temperature. The method may further include forming a second niobium layer comprising a second set of patterned niobium traces on the second dielectric layer. The method may further include forming a third dielectric layer on the second niobium layer by spinning on photo-imageable polyimide on the second niobium layer and curing the photo-imageable polyimide at a third temperature, where the third temperature is lower than the second temperature.

This Summary is provided to introduce a selection of concepts in a simplified form that are further described below in the Detailed Description. This Summary is not intended to identify key features or essential features of the claimed subject matter, nor is it intended to be used to limit the scope of the claimed subject matter.

BRIEF DESCRIPTION OF THE DRAWINGS

The present disclosure is illustrated by way of example and is not limited by the accompanying figures, in which like references indicate similar elements. Elements in the figures are illustrated for simplicity and clarity and have not necessarily been drawn to scale.

DETAILED DESCRIPTION

Figure 1:
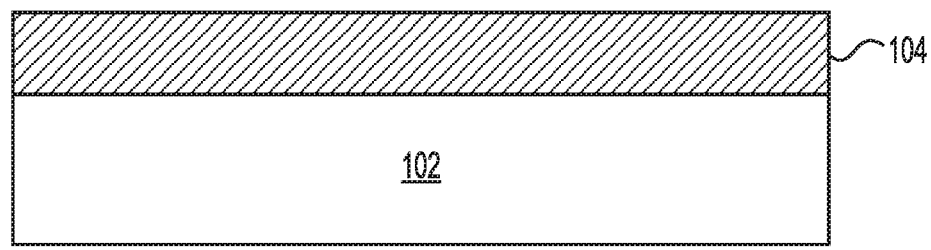
FIG. 1 shows a cross-section view of at least one step used in forming a superconducting apparatus in accordance with one example.

Examples described in this disclosure relate to superconducting apparatuses and devices. Superconducting apparatuses and devices use Josephson junctions to implement the functionality associated with a circuit. An exemplary Josephson junction may include two superconductors coupled via a region that impedes current. The region that impedes current may be a physical narrowing of the superconductor itself, a metal region, or a thin insulating barrier. As an example, the Superconductor-Insulator-Superconductor (SIS) type of Josephson junctions may be implemented as part of the superconducting circuits. As an example, superconductors are materials that can carry a direct electrical current (DC) in the absence of an electric field. Superconductors have a critical temperature (Tc) below which they have zero resistance. Niobium, one such superconductor, has a critical temperature (Tc) of 9.3 Kelvin degrees. At temperatures below Tc, niobium is superconductive; however, at temperatures above Tc, it behaves as a normal metal with electrical resistance. Thus, in the SIS type of Josephson junctions superconductors may be niobium superconductors and insulators may be $Al_2O_3$ barriers. In SIS type of junctions, the superconducting electrons are described by a quantum mechanical wave-function. A changing phase difference in time of the phase of the superconducting electron wave-function between the two superconductors corresponds to a potential difference between the two superconductors.

Various superconducting circuits including transmission lines can be formed by coupling multiple Josephson junctions by inductors or other components, as needed. Microwave pulses can travel via these transmission lines under the control of at least one clock. The microwave pulses can be positive or negative or a combination thereof. The microwave pulses may have a frequency of up to 10 GHz or higher. Any circuit board or other type of structure, such as an interposer having such superconducting circuits may be required to support not only the high-frequency microwave signals but also direct current (DC) signals.

The present disclosure relates to a superconducting apparatus, such as a superconducting printed circuit board, a superconducting interposer, or a similar structure. The superconducting interposer may be used as part of multichip modules for use in cryogenic environments (e.g., at or below 4 Kelvin). In one example, the superconducting apparatus may include a stack of superconducting layers and dielectric layers formed on a substrate. In one example, the superconducting apparatus may be formed to support superconducting traces with impedance in a range between 20 Ohm to 50 Ohm. In addition, the superconducting apparatus may be formed to support signals ranging from DC to signals having a frequency that is greater than 10 GHz. In this example, the superconducting apparatus may be fabricated over large silicon substrates such as 200 mm wafers, 300 mm wafers or even larger wafers. Moreover, in this example, the design rules may be chosen to support 1× lithography, with a minimum feature size of about 5 μm. This example may require dielectrics having a thickness of greater than 1 μm to support the required impedances. The thicker dielectrics and wider line widths of the superconducting traces may advantageously allow the impedances of the lines to be in a range between approximately 20 Ohm to approximately 50 Ohm without requiring the use of complicated processes with sub-micron dimensions. In addition, line traces formed using sub-micron processes may require shorter lines to be stitched together, which may further increase the process complexity. In one example, the niobium traces may support an impedance of approximately 50 Ohm at a linewidth of approximately 7 μm and the niobium traces may support an impedance of approximately 20 Ohm at a linewidth of approximately 25 μm.

In one example, the substrate could be a silicon wafer or any other insulating or conducting material. Also, in this example, the traces and ground planes may be formed by sputtering niobium, or a similar superconducting material. As an example, compounds of niobium such as niobium nitride (NbN) or niobium titanium nitride (NbTiN) may also be used. Other physical vapor deposition (PVD) methods, such as molecular beam epitaxy (MBE) may also be used. Depending on the type of the material used for the traces chemical vapor deposition processes, such as atomic layer deposition (ALD) may also be used. Thus, for example, the niobium compounds such as NbN and NbTiN may be formed using the ALD process. The niobium traces may have a width in a range between 4 μm and 20 μm, Niobium may be deposited by sputtering it over a dielectric layer and defining it by subtractive etch such as CF4 or HF6 Reactive Ion Etching (RIE). In one example; the niobium traces may be coated with a thin layer of aluminum to improve the electrical properties of the traces.

In the example superconducting apparatus, the dielectric could be spin on polyimide. In one example; the dielectric layer may have a thickness in a range between 1 μm and 5 μm. For example, the dielectric could be HD4110 or PI-2611 having a dielectric constant of about 3.2 and having a low loss tangent of approximately $2e^{-4}$ at a temperature of 4 Kelvin for signals having a frequency of 10 GHz. In one example, the cure temperatures may be kept at or below 225 degrees Centigrade so as not to adversely affect the superconducting material, such as niobium. The superconducting apparatus may further include vias that may be formed by conformal deposition of the niobium in the same deposition step as the traces or ground plane. The via wells could be patterned directly in a photo-imageable polyimide, or etched in a separate step. The metal traces and vias may be defined in the same subtractive etch step. The pad connections may be configured to support Ti/Au or Ti/Al pads for a variety of bump and wire bond technologies, such as Indium bump, C4 bump, or Copper pillar.

FIG. 1 shows a cross-section view 100 of a superconducting apparatus during a processing stage in accordance with one example. As shown, during this processing stage the superconducting apparatus may include a dielectric layer 104 formed over a substrate 102. Substrate 102 may be a silicon substrate, a sapphire substrate, a glass substrate, or any other suitable substrate, Dielectric layer 104 may be formed by depositing a dielectric (e.g., a liquid polymer) on substrate 102. In one example, dielectric layer 104 may be formed by spinning on polyimide on substrate 102. As an example, liquid polyimide may be applied to substrate 102 while spinning the liquid over the substrate at a high rate (e.g., at a rate of a few thousand revolutions per minute). After depositing the liquid dielectric material on substrate 102, it may be cured at a certain temperature to convert the dielectric material into a solid form. The polymerization of the liquid dielectric during the curing process may generate the solid dielectric. In this example, the dielectric layer may have a thickness in a range between 1 μm and 5 μm. For example, the dielectric could be HD4110 or PI-2611 having a dielectric constant of about 3.2 and having a low loss tangent of approximately $2e^{-4}$ at a temperature of 4 Kelvin for signals having a frequency of 10 GHz. In one example, the cure temperatures may be kept at or below 275 degrees Centigrade. Although FIG. 1 shows a certain number of layers of the superconducting apparatus arranged in a certain manner, there could be more or fewer numbers of layers arranged differently.

Figure 2:
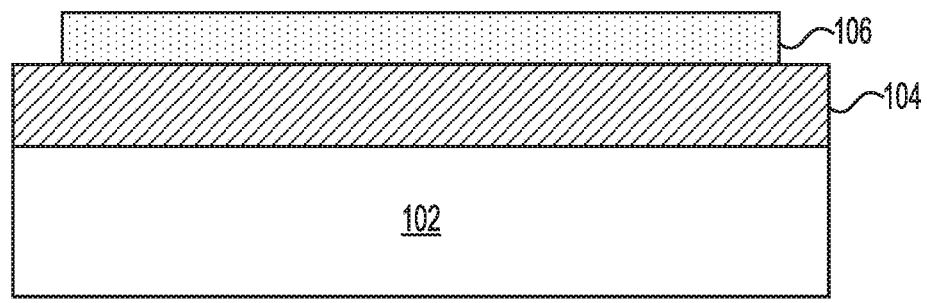
FIG. 2 shows a cross-section view of at least one step used in forming a superconducting apparatus in accordance with one example.

FIG. 2 shows a cross-section view 200 of a superconducting apparatus at another stage of processing in accordance with one example. A superconducting layer 106 may be formed over dielectric layer 104. Superconducting layer 106 may be formed using any of the deposition techniques, such as CVS or PCVD and then patterning the deposited material using photolithography. In this example, superconducting layer 106 may be formed by depositing niobium over dielectric layer 104. A photo-lithography process may be used to pattern superconducting layer 106 to create superconducting wires or other superconducting structures. Next, using processes, such as chemical-mechanical polishing, the excess portions of the superconducting layer 106 may be removed. In one example, the superconducting wires may be formed using niobium or other suitable metals. Niobium superconducting wires may be 0.2 microns wide and approximately 25 microns long. Certain such wires may be as wide as 20 microns and may be slotted. The wires may be almost as long as the length or the width of an entire die. The layout for the superconducting structures may be created using a place and route design tool that is used to create the layout for the superconducting wires or other elements. As an example, photo-resist may be patterned to protect only those areas of superconducting layer 106 that will be formed as superconducting wires or other structures as defined by the layout of the particular layer, such as a metal layer. Other superconducting metals or metal alloys may also be used as part of this step. In one example, the vias and the traces may be formed by conformal deposition of niobium in the same deposition step as the one used for forming the traces. Niobium may be deposited by sputtering or other similar processes. Other physical vapor deposition (PVD) methods, such as molecular beam epitaxy (MBE) may also be used. In one example, the niobium traces and vias may be formed using proximity lithography. Proximity lithography may include placing the photomask slightly lifted off the photoresist or the photo-imageable dielectric layer that is being exposed to ultra-violet light. In one example, the photomask may be lifted 1 μm off the photoresist or another layer that is being exposed to the ultra-violet light. After the exposure to the light an etching step may be performed to remove the exposed areas of the photoresist or the photo-imageable dielectric layer. This step may involve using a wet etching process or a dry etching process. Although FIG. 2 shows a certain number of layers of the superconducting apparatus arranged in a certain manner, there could be more or fewer numbers of layers arranged differently.

Figure 3:
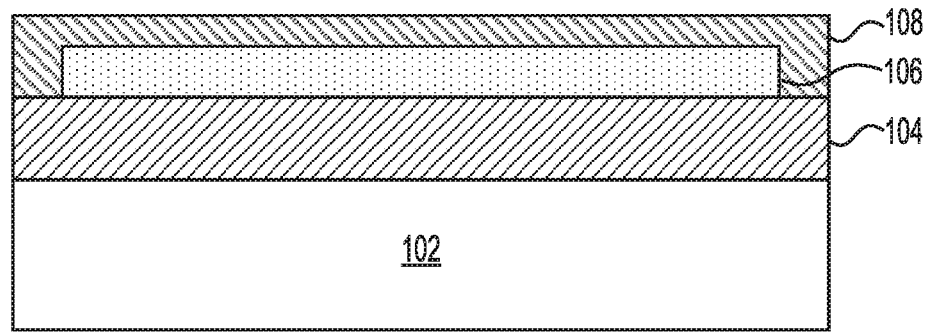
FIG. 3 shows a cross-section view of at least one step used in forming a superconducting apparatus in accordance with one example.

FIG. 3 shows a cross-section view 300 of a superconducting apparatus at another stage of processing in accordance with one example. As shown, during this processing stage the superconducting apparatus may include a dielectric layer 108 formed over a superconducting layer 106, Dielectric layer 108 may be formed by depositing a dielectric (e.g., a liquid polymer) on superconducting layer 106. In one example, dielectric layer 108 may be formed by spinning on polyimide on superconducting layer 106. In this example, the dielectric layer may have a thickness in a range between 1 μm and 5 μm. In addition, in one example, dielectric layer 108 may be a photo-imageable polyimide. For example, the dielectric could be HD4110 or PI-2611 having a dielectric constant of about 3.2 and having a low loss tangent of approximately $2e^{-4}$ at a temperature of 4 Kelvin for signals having a frequency of 10 GHz. This way the formation of vias or other superconducting structures may not require the additional step of depositing a photosensitive material. In one example, the cure temperatures may be kept at or below 225 degrees Centigrade. In one example, the cure temperature for dielectric layer 108 may be selected to be lower by at least 25 degrees Centigrade than the cure temperature for dielectric layer 104. In another example, the cure temperature for dielectric layer 108 may be selected to be lower by at least 50 degrees Centigrade than the cure temperature for dielectric layer 104. Lower cure temperatures may advantageously not cause any damage to niobium. Additionally, while dielectric layer 108 may not be completely polymerized, the use of superconducting apparatus in a cryogenic environment may ensure that this lack of complete polymerization does not contribute significantly to any structural or operational issues with the semiconductor apparatus. Although FIG. 3 shows a certain number of layers of the superconducting apparatus arranged in a certain manner, there could be more or fewer numbers of layers arranged differently.

Figure 4:
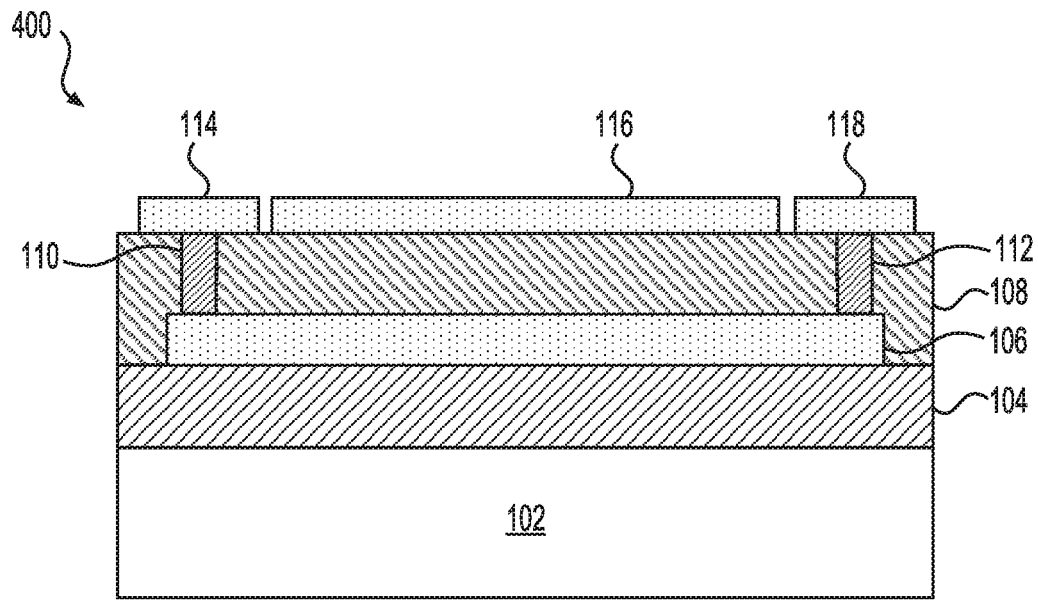
FIG. 4 shows a cross-section view of at least one step used in forming a superconducting apparatus in accordance with one example.

FIG. 4 shows a cross-section view 400 of a superconducting apparatus at another stage of processing in accordance with one example. As shown, during this processing stage the superconducting apparatus may include another superconducting layer formed over dielectric layer 108. Vias 110 and 112 may be formed by creating via or contact holes in dielectric layer 108 and filling them with niobium or a similar superconducting material. Additional superconducting traces including 114, 116, and 118 may be formed as part of the next superconducting layer included in the superconducting apparatus. In one example, the superconducting wires may be formed using niobium or other suitable metals. Niobium superconducting wires may be 0.2 microns wide and approximately 25 microns long. Certain such wires may be as wide as 20 microns and may be slotted. The wires may be almost as long as the length or the width of an entire die. The layout for the superconducting structures may be created using a place and route design tool that is used to create the layout for the superconducting wires or other elements. As an example, photo-resist may be patterned to protect only those areas of the superconducting layer that will be formed as superconducting wires or other structures as defined by the layout of the particular layer, such as a metal layer. Other superconducting metals or metal alloys may also be used as part of this step. In one example, the vias may be formed by conformal deposition of niobium in the same deposition step as the one used for forming the traces. Niobium may be deposited by sputtering or other similar processes. Other physical vapor deposition (PVD) methods, such as molecular beam epitaxy (MBE) may also be used. In one example, the niobium traces and vias may be formed using proximity lithography. Proximity lithography may include placing the photomask slightly lifted off the photoresist or the photo-imageable dielectric layer that is being exposed to ultra-violet light. In one example, the photomask may be lifted 1 μm off the photoresist or another layer that is being exposed to the ultra-violet light. After the exposure to the light an etching step may be performed to remove the exposed areas of the photoresist or the photo-imageable dielectric layer. This step may involve using a wet etching process or a dry etching process. Although FIG. 4 shows a certain number of layers of the superconducting apparatus arranged in a certain manner, there could be more or fewer numbers of layers arranged differently.

Figure 5:
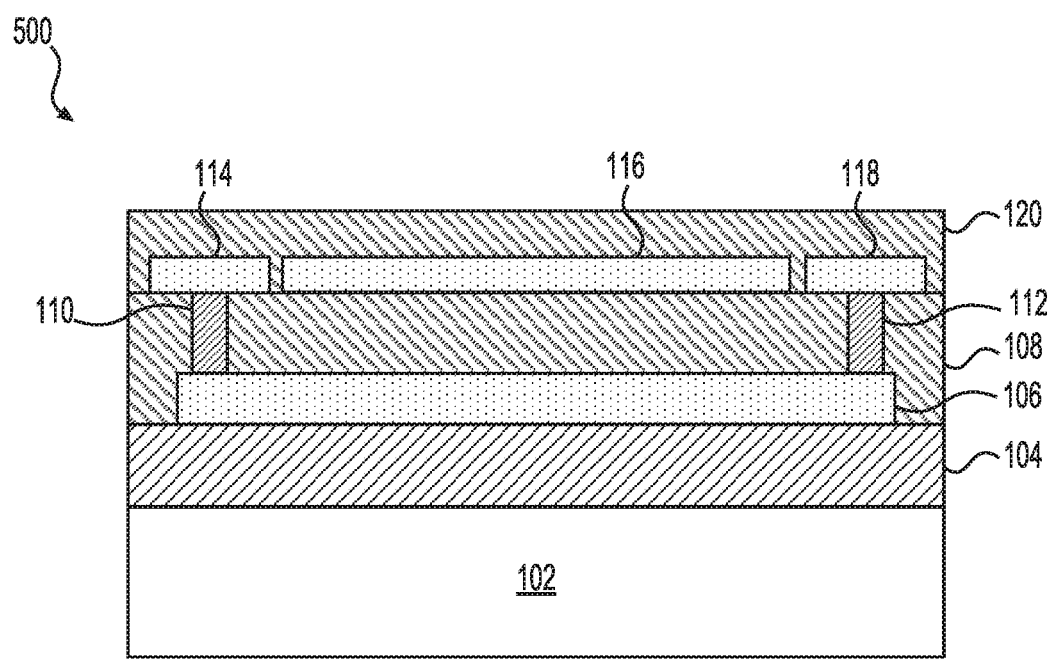
FIG. 5 shows a cross-section view of at least one step used in forming a superconducting apparatus in accordance with one example.
Figure 6:
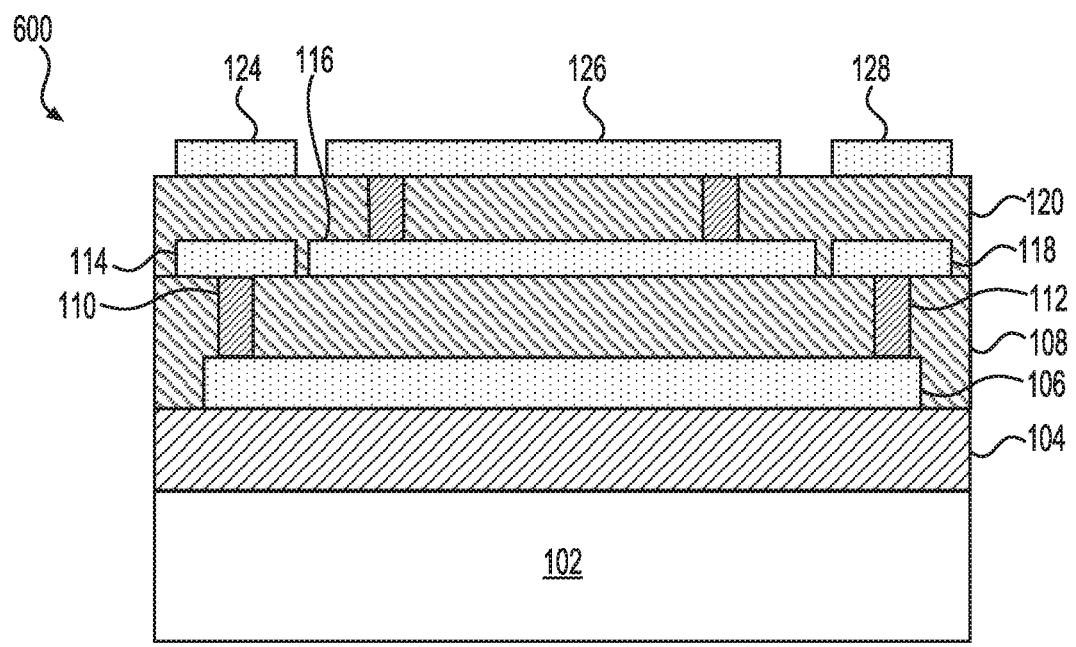
FIG. 6 shows a cross-section view of at least one step used in forming a superconducting apparatus in accordance with one example.
Figure 7:
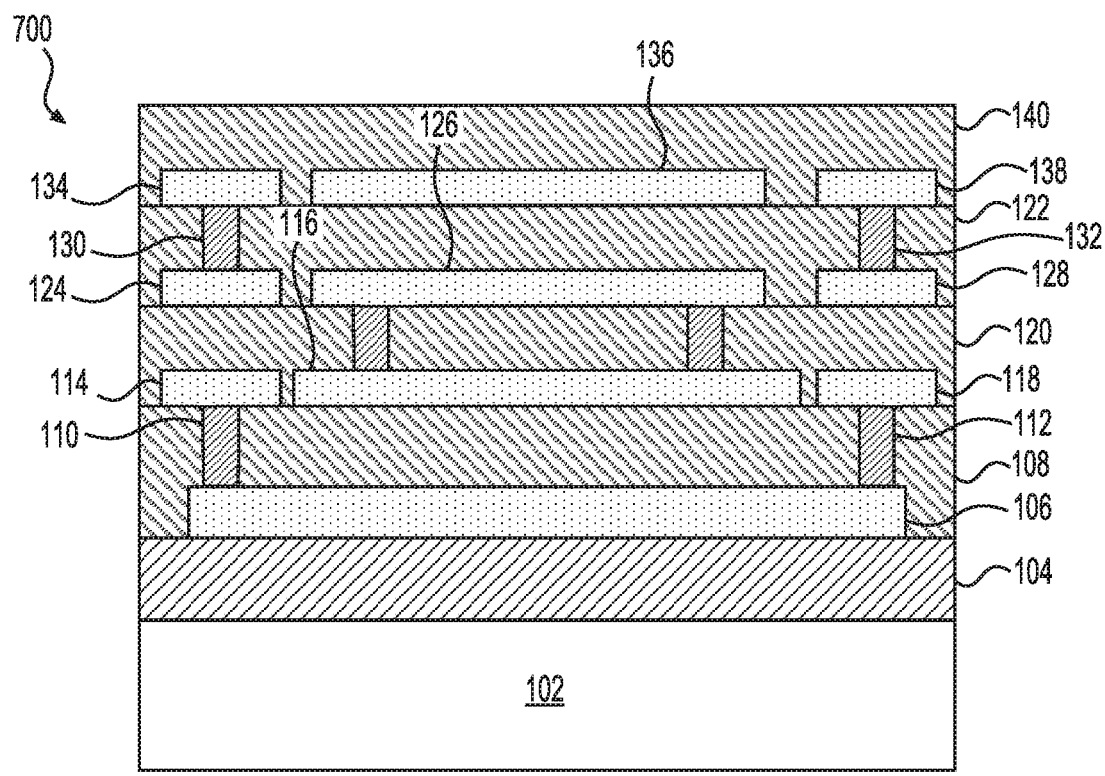
FIG. 7 shows a cross-section view of at least one step used in forming a superconducting apparatus in accordance with one example.

FIG. 5 shows a cross-section view 500 of at least one step used in forming a superconducting apparatus in accordance with one example. As shown, during this processing stage the superconducting apparatus may include a dielectric layer 120 formed over a superconducting traces or planes (for example the superconducting layer including superconducting traces 114, 116, and 118). Dielectric layer 120 may be formed by depositing a dielectric (e.g., a liquid polymer) on the superconducting layer. In one example, dielectric layer 120 may be formed by spinning on polyimide on the superconducting layer. In this example, the dielectric layer may have a thickness in a range between 1 µm and 5 µm. In addition, in one example, dielectric layer 120 may be a photo-imageable polyimide. For example, the dielectric could be HD4110 or PI-2611 having a dielectric constant of about 3.2 and having a low loss tangent of approximately $2e^{-4}$ at a temperature of 4 Kelvin for signals having a frequency of 10 GHz. This way the formation of vias or other superconducting structures may not require the additional step of depositing a photosensitive material. In one example, the cure temperatures may be kept at or below 225 degrees Centigrade. In one example, the cure temperature for dielectric layer 120 may be selected to be lower by at least 25 degrees Centigrade than the cure temperature for dielectric layer 108. In another example, the cure temperature for dielectric layer 120 may be selected to be lower by at least 50 degrees Centigrade than the cure temperature for dielectric layer 108. Although FIG. 5 shows a certain number of layers of the superconducting apparatus arranged in a certain manner, there could be more or fewer numbers of layers arranged differently, FIG. 6 shows a cross-section view 600 of at least one step used in forming a superconducting apparatus in accordance with one example. As shown, during a processing stage the superconducting apparatus may include another superconducting layer formed over dielectric layer 120. Vias may be formed by creating via or contact holes in dielectric layer 120 and filling them with niobium or a similar superconducting material. Additional superconducting traces including 124, 126, and 128 may be formed as part of the next superconducting layer included in the superconducting apparatus. In one example, the superconducting wires may be formed using niobium or other suitable metals. Niobium superconducting wires may be 0.2 microns wide and approximately 25 microns long. Certain such wires may be as wide as 20 microns and may be slotted. The wires may be almost as long as the length or the width of an entire die. The layout for the superconducting structures may be created using a place and route design tool that is used to create the layout for the superconducting wires or other elements. As an example, photo-resist may be patterned to protect only those areas of the superconducting layer that are needed to be formed as superconducting wires or other structures as defined by the layout of the particular layer, such as a metal layer. Other superconducting metals or metal alloys may also be used as part of this step. In one example, the vias may be formed by conformal deposition of niobium in the same deposition step as the one used for forming the traces. Niobium may be deposited by sputtering or other similar processes. Other physical vapor deposition (PVD) methods, such as molecular beam epitaxy (MBE) may also be used. In one example, the niobium traces and vias may be formed using proximity lithography. Proximity lithography may include placing the photomask slightly lifted off the photoresist or the photo-imageable dielectric layer that is being exposed to ultra-violet light. In one example, the photomask may be lifted 1 µm off the photoresist or another layer that is being exposed to the ultra-violet light. After the exposure to the light an etching step may be performed to remove the exposed areas of the photoresist or the photo-imageable dielectric layer. This step may involve using a wet etching process or a dry etching process. Although FIG. 6 shows a certain number of layers of the superconducting apparatus arranged in a certain manner, there could be more or fewer numbers of layers arranged differently, FIG. 7 shows a cross-section view 700 of at least one step used in forming a superconducting apparatus in accordance with one example. As shown, during this processing stage the superconducting apparatus may include a dielectric layer 122 formed over superconducting traces or planes (for example the superconducting layer including superconducting traces 124, 126, and 128). Dielectric layer 122 may be formed by depositing a dielectric (e.g., a liquid polymer) on the superconducting layer. In one example, dielectric layer 122 may be formed by spinning on polyimide on the superconducting layer. In this example, the dielectric layer may have a thickness in a range between 1 µm and 5 µm. In addition, in one example, dielectric layer 122 may be a photo-imageable polyimide. For example, the dielectric could be HD4110 or PI-2611 having a dielectric constant of about 3.2 and having a low loss tangent of approximately $2e^{-4}$ at a temperature of 4 Kelvin for signals having a frequency of 10 GHz. This way the formation of vias or other superconducting structures may not require the additional step of depositing a photosensitive material. In one example, the cure temperatures may be kept at or below 225 degrees Centigrade. In one example, the cure temperature for dielectric layer 122 may be selected to be lower by at least 25 degrees Centigrade than the cure temperature for dielectric layer 120. In another example, the cure temperature for dielectric layer 122 may be selected to be lower by at least 50 degrees Centigrade than the cure temperature for dielectric layer 120.

With continued reference to FIG. 7, at this processing stage vias 130 and 132 and superconducting traces 134, 136, and 138 may be formed. In one example, the superconducting wires may be formed using niobium or other suitable metals. Niobium superconducting wires may be 0.2 microns wide and approximately 25 microns long. Certain such wires may be as wide as 20 microns and may be slotted. The wires may be almost as long as the length or the width of an entire die. The layout for the superconducting structures may be created using a place and route design tool that is used to create the layout for the superconducting wires or other elements. As an example, photo-resist may be patterned to protect only those areas of the superconducting layer that are needed to be formed as superconducting wires or other structures as defined by the layout of the particular layer, such as a metal layer. Other superconducting metals or metal alloys may also be used as part of this step. In one example, the vias may be formed by conformal deposition of niobium in the same deposition step as the one used for forming the traces. Niobium may be deposited by sputtering or other similar processes. Other physical vapor deposition (PVD) methods, such as molecular beam epitaxy (MBE) may also be used. In one example, the niobium traces and vias may be formed using proximity lithography. Proximity lithography may include placing the photomask slightly lifted off the photoresist or the photo-imageable dielectric layer that is being exposed to ultra-violet light. In one example, the photomask may be lifted 1 µm off the photoresist or another layer that is being exposed to the ultra-violet light. After the exposure to the light an etching step may be performed to remove the exposed areas of the photoresist or the photo-imageable dielectric layer. This step may involve using a wet etching process or a dry etching process. Another dielectric layer 140 may be formed as part of this stage. This layer may be formed using similar processes as described earlier. In one example, the cure temperatures may be kept at or below 225 degrees Centigrade. In one example, the cure temperature for dielectric layer 140 may be selected to be lower by at least 25 degrees Centigrade than the cure temperature for dielectric layer 122. In another example, the cure temperature for dielectric layer 140 may be selected to be lower by at least 50 degrees Centigrade than the cure temperature for dielectric layer 122. Although FIG. 7 shows a certain number of layers of the superconducting apparatus arranged in a certain manner, there could be more or fewer numbers of layers arranged differently.

Figure 8:
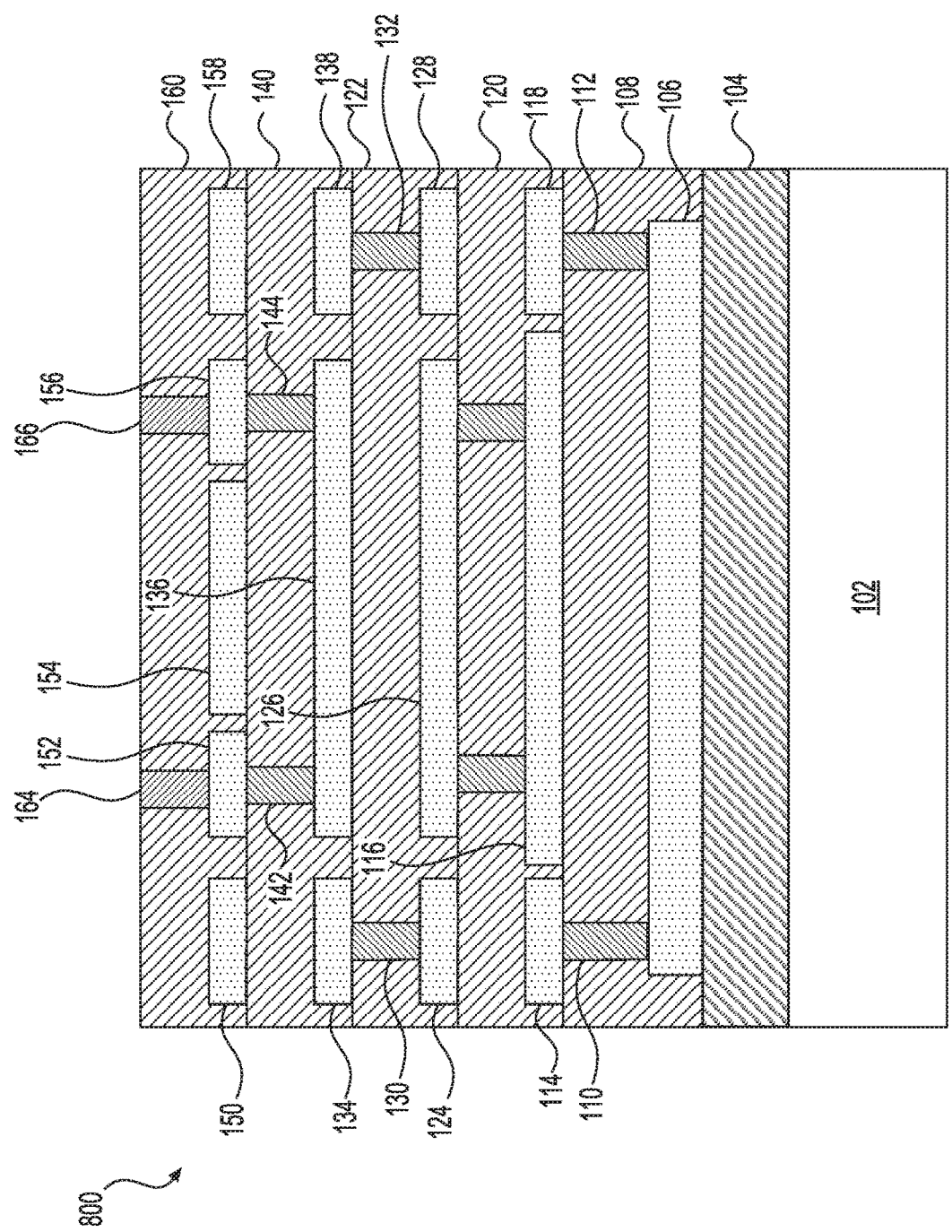
FIG. 8 shows a cross-section view of at least one step used in forming a superconducting apparatus in accordance with one example.

FIG. 8 shows a cross-section view 800 of at least one step used in forming a superconducting apparatus in accordance with one example. At this processing stage, vias 142 and 144 and superconducting traces 150, 152, 154, 156, and 158 may be formed. In one example, the superconducting wires may be formed using niobium or other suitable metals. Niobium superconducting wires may be 0.2 microns wide and approximately 25 microns long. Certain such wires may be as wide as 20 microns and may be slotted. The wires may be almost as long as the length or the width of an entire die. The layout for the superconducting structures may be created using a place and route design tool that is used to create the layout for the superconducting wires or other elements. As an example, photo-resist may be patterned to protect only those areas of the superconducting layer that are needed to be formed as superconducting wires or other structures as defined by the layout of the particular layer, such as a metal layer. Other superconducting metals or metal alloys may also be used as part of this step. In one example, the vias may be formed by conformal deposition of niobium in the same deposition step as the one used for forming the traces. Niobium may be deposited by sputtering or other similar processes. Other physical vapor deposition (PVD) methods, such as molecular beam epitaxy (MBE) may also be used. In one example, the niobium traces and vias may be formed using proximity lithography. Proximity lithography may include placing the photomask slightly lifted off the photoresist or the photo-imageable dielectric layer that is being exposed to ultra-violet light. In one example, the photomask may be lifted 1 μm off the photoresist or another layer that is being exposed to the ultra-violet light. After the exposure to the light an etching step may be performed to remove the exposed areas of the photoresist or the photo-imageable dielectric layer. This step may involve using a wet etching process or a dry etching process. Another dielectric layer 160 may be formed as part of this stage. This layer may be formed using similar processes as described earlier. In one example, the cure temperatures may be kept at or below 225 degrees Centigrade. In one example, the cure temperature for dielectric layer 160 may be selected to be lower by at least 25 degrees Centigrade than the cure temperature for dielectric layer 140. In another example, the cure temperature for dielectric layer 160 may be selected to be lower by at least 50 degrees Centigrade than the cure temperature for dielectric layer 140.

With continued reference to FIG. 8, at this processing state, vias 164 and 166 may be formed to provide for pad connections. The pad connections may be configured to support titanium/gold (Ti/Au) or titanium/aluminum (Ti/Al) pads for a variety of bump and wire bond technologies, such as Indium bump, C4 bump, or Copper pillar. Although FIG. 8 shows a certain number of layers of the superconducting apparatus arranged in a certain manner, there could be more or fewer numbers of layers arranged differently. In addition, although FIGS. 1-8 show certain steps being performed in a certain order, additional or fewer steps, in a different order may be performed to fabricate the superconducting apparatus.

In one example, the dielectric layers, starting with the one closest to substrate 102, may be cured at a progressively lower temperature. Thus, dielectric layer 104 may be cured at a temperature of 250 degrees Centigrade, dielectric layer 108 may be cured at a temperature of 225 degrees Centigrade, dielectric layer 120 may be cured at a temperature of 200 degrees Centigrade, dielectric layer 122 may be cured at a temperature of 175 degrees Centigrade, dielectric layer 140 may be cured at a temperature of 150 degrees Centigrade, and dielectric layer 160 may be cured at a temperature of 125 degrees Centigrade. In other examples, the curing temperature difference may be less than or more than 25 degrees Centigrade.

With continued reference to FIG. 8, in one example, superconducting layer 106 may be configured to distribute clock signals through the superconducting apparatus. The next set of superconducting traces (e.g., superconducting traces 114, 116, and 118) may be configured to distribute clock signals through the superconducting apparatus. The next set of superconducting traces (e.g., superconducting traces 124, 126, and 128) may be configured to act as the ground plane for the superconducting apparatus. The next set of superconducting traces (e.g., superconducting traces 134, 136, and 138) may be configured to distribute signals other than the clock signals through the superconducting apparatus. The next set of superconducting traces (e.g., superconducting traces 150, 152, 154, 156, and 158) may be configured to distribute signals other than the clock signals through the superconducting apparatus. Indeed, the functionality of the various superconducting layers could be modified based on the requirements associated with the superconducting apparatus. In addition, the materials used for the dielectric layers may be benzocyclobutene (BCB) or poly phenyl quinoxaline (PPQ) and photo-sensitive versions of these dielectric materials.

In conclusion, the present disclosure relates to a method comprising forming a first dielectric layer on a substrate by depositing a first dielectric material on the substrate and curing the first dielectric material at a first temperature. The method may further include forming a first superconducting layer comprising a first set of patterned superconducting traces on the first dielectric layer. The method may further include forming a second dielectric layer on the first superconducting layer by depositing a second dielectric material on the first superconducting layer and curing the second dielectric material at a second temperature, where the second temperature is lower than the first temperature. The method may further include forming a second superconducting layer comprising a second set of patterned superconducting traces on the second dielectric layer.

In one example of the method the second temperature may be lower than the first temperature by at least 50 degrees Centigrade. The depositing the first dielectric material on the substrate may comprise spinning on a liquid polymer based dielectric on the substrate. The depositing the second dielectric material on the substrate may comprise spinning on a liquid polymer based dielectric on the first superconducting layer. Each of the first dielectric material and the second dielectric material may comprise a photo-imageable polyimide.

In one example, the forming the second superconducting layer may further comprise depositing and patterning at least one superconducting material to form the second set of the patterned superconducting traces and at least one interconnect structure for connecting at least one of the second set of the patterned superconducting traces with at least one of the first set of the patterned superconducting traces. Each of the first set of the patterned superconducting traces and the second set of the patterned superconducting traces may be formed using proximity lithography. The superconducting material may comprise niobium.

In another aspect, the present disclosure relates to a method comprising forming a first dielectric layer on a substrate by depositing a first dielectric material on the substrate and curing the first dielectric material at a first temperature. The method may further include forming a first niobium layer comprising a first set of patterned niobium traces on the first dielectric layer. The method may further include forming a second dielectric layer on the first niobium layer by depositing a second dielectric material on the first niobium layer and curing the second dielectric material at a second temperature, where the second temperature is approximately equal to or lower than the first temperature by at least 25 degrees Centigrade. The method may further include forming a second niobium layer comprising a second set of patterned niobium traces on the second dielectric layer.

The depositing the first dielectric material on the substrate may comprise spinning on a liquid polymer based dielectric on the substrate. The depositing the second dielectric material on the substrate may comprise spinning on a liquid polymer based dielectric on the first niobium layer. Each of the first dielectric material and the second dielectric material may comprise a photo-imageable polyimide.

In this example, the forming the second niobium layer may further comprise depositing and patterning niobium to form the second set of the patterned niobium traces and at least one niobium via for connecting at least one of the second set of the patterned niobium traces with at least one of the first set of the patterned niobium traces. Each of the first set of the patterned niobium traces and the second set of the patterned niobium traces may be formed using proximity lithography.

In yet another aspect, the present disclosure relates to a method comprising forming a first dielectric layer on a substrate by spinning on polyimide on the substrate and curing the polyimide at a first temperature. The method may further include forming a first niobium layer comprising a first set of patterned niobium traces on the first dielectric layer. The method may further include forming a second dielectric layer on the first niobium layer by spinning on photo-imageable polyimide on the first niobium layer and curing the photo-imageable polyimide at a second temperature, where the second temperature is lower than the first temperature. The method may further include forming a second niobium layer comprising a second set of patterned niobium traces on the second dielectric layer. The method may further include forming a third dielectric layer on the second niobium layer by spinning on photo-imageable polyimide on the second niobium layer and curing the photo-imageable polyimide at a third temperature, where the third temperature is lower than the second temperature.

In this example, the forming the second niobium layer may further comprise depositing and patterning niobium to form the second set of the patterned niobium traces and at least one niobium via for connecting at least one of the second set of the patterned niobium traces with at least one of the first set of the patterned niobium traces. Each of the first set of the patterned niobium traces and the second set of the patterned niobium traces may be formed using proximity lithography.

The second temperature may be lower than the first temperature by at least 25 degrees Centigrade and the third temperature may be lower than the second temperature by at least 25 degrees Centigrade.

The method may further comprise forming at least one via in the second dielectric layer, where the via comprises niobium. In this example, the at least one via may be formed in a same step as the forming the second niobium layer, and where the at least one via may be formed by conformal deposition of the niobium.

It is to be understood that the methods, modules, and components depicted herein are merely exemplary. For example, and without limitation, illustrative types of superconducting devices may include Field-Programmable Gate Arrays (FPGAs), Application-Specific Integrated Circuits (ASICs), Application-Specific Standard Products (ASSPs), System-on-a-Chip systems (SOCs), Complex Programmable Logic Devices (CPLDs), etc.

In addition, in an abstract, but still definite sense, any arrangement of components to achieve the same functionality is effectively "associated" such that the desired functionality is achieved. Hence, any two components herein combined to achieve a particular functionality can be seen as "associated with" each other such that the desired functionality is achieved, irrespective of architectures or inter-medial components. Likewise, any two components so associated can also be viewed as being "operably connected," or "coupled," to each other to achieve the desired functionality.

Furthermore, those skilled in the art will recognize that boundaries between the functionality of the above-described operations are merely illustrative. The functionality of multiple operations may be combined into a single operation, and/or the functionality of a single operation may be distributed in additional operations. Moreover, alternative embodiments may include multiple instances of a particular operation, and the order of operations may be altered in various other embodiments.

Although the disclosure provides specific examples, various modifications and changes can be made without departing from the scope of the disclosure as set forth in the claims below. Accordingly, the specification and figures are to be regarded in an illustrative rather than a restrictive sense, and all such modifications are intended to be included within the scope of the present disclosure. Any benefits, advantages, or solutions to problems that are described herein with regard to a specific example are not intended to be construed as a critical, required, or essential feature or element of any or all the claims.

Furthermore, the terms "a" or "an," as used herein, are defined as one or more than one. Also, the use of introductory phrases such as "at least one" and "one or more" in the claims should not be construed to imply that the introduction of another claim element by the indefinite articles "a" or "an" limits any particular claim containing such introduced claim element to inventions containing only one such element, even when the same claim includes the introductory phrases "one or more" or "at least one" and indefinite articles such as "a" or "an." The same holds true for the use of definite articles.

Unless stated otherwise, terms such as "first" and "second" are used to arbitrarily distinguish between the elements such terms describe. Thus, these terms are not necessarily intended to indicate temporal or other prioritization of such elements.

The invention claimed is:

1. A method comprising:
   forming a first dielectric layer on a substrate by depositing a first dielectric material on the substrate and curing the first dielectric material at a first temperature;
   forming a first superconducting layer comprising a first set of patterned superconducting traces on the first dielectric layer;
   forming a second dielectric layer on the first superconducting layer by depositing a second dielectric material on the first superconducting layer and curing the second dielectric material at a second temperature, wherein the second temperature is lower than the first temperature; and
   forming a second superconducting layer comprising a second set of patterned superconducting traces on the second dielectric layer, wherein each of the first superconducting layer and the second superconducting layer comprises a superconducting metal, and wherein each of the first temperature and the second temperature is selected to not adversely affect the superconducting metal by damaging the superconducting metal.

2. The method of claim 1, wherein the second temperature is lower than the first temperature by at least 50 degrees Centigrade.

3. The method of claim 1, wherein the depositing the first dielectric material on the substrate comprises spinning on a liquid polymer based dielectric on the substrate.

4. The method of claim 3, wherein the depositing the second dielectric material on the substrate comprises spinning on a liquid polymer based dielectric on the first superconducting layer.

5. The method of claim 1, wherein the forming the second superconducting layer further comprises depositing and patterning at least the superconducting metal to form the second set of the patterned superconducting traces and at least one interconnect structure for connecting at least one of the second set of the patterned superconducting traces with at least one of the first set of the patterned superconducting traces.

6. The method of claim 5, wherein the superconducting metal comprises niobium.

7. The method of claim 1, wherein each of the first set of the patterned superconducting traces and the second set of the patterned superconducting traces is formed using lithography.

8. The method of claim 1, wherein each of the first dielectric material and the second dielectric material comprises a photo-imageable polyimide.

9. A method comprising:
   forming a first dielectric layer on a substrate by depositing a first dielectric material on the substrate and curing the first dielectric material at a first temperature;
   forming a first niobium layer comprising a first set of patterned niobium traces on the first dielectric layer;
   forming a second dielectric layer on the first niobium layer by depositing a second dielectric material on the first niobium layer and curing the second dielectric material at a second temperature, wherein the second temperature is approximately equal to or lower than the first temperature by at least 25 degrees Centigrade; and
   forming a second niobium layer comprising a second set of patterned niobium traces on the second dielectric layer, wherein each of the first temperature and the second temperature is selected to not adversely affect each of the first niobium layer and the second niobium layer by damaging niobium, and wherein each of the first temperature and the second temperature is selected to be below 275 degrees Centigrade.

10. The method of claim 9, wherein the depositing the first dielectric material on the substrate comprises spinning on a liquid polymer based dielectric on the substrate.

11. The method of claim 10, wherein the depositing the second dielectric material on the substrate comprises spinning on a liquid polymer based dielectric on the first niobium layer.

12. The method of claim 9, wherein the forming the second niobium layer further comprises depositing and patterning niobium to form the second set of the patterned niobium traces and at least one niobium via for connecting at least one of the second set of the patterned niobium traces with at least one of the first set of the patterned niobium traces.

13. The method of claim 9, wherein each of the first set of the patterned niobium traces and the second set of the patterned niobium traces is formed using lithography.

14. The method of claim 9, wherein each of the first dielectric material and the second dielectric material comprises a photo-imageable polyimide.

15. A method comprising:
   forming a first dielectric layer on a substrate by spinning on polyimide on the substrate and curing the polyimide at a first temperature;
   forming a first niobium layer comprising a first set of patterned niobium traces on the first dielectric layer;
   forming a second dielectric layer on the first niobium layer by spinning on photo-imageable polyimide on the first niobium layer and curing the photo-imageable polyimide at a second temperature, wherein the second temperature is approximately equal to or lower than the first temperature by at least 25 degrees Centigrade;
   forming a second niobium layer comprising a second set of patterned niobium traces on the second dielectric layer; and
   forming a third dielectric layer on the second niobium layer by spinning on photo-imageable polyimide on the second niobium layer and curing the photo-imageable polyimide at a third temperature, wherein the third temperature is lower than the second temperature, and wherein each of the first temperature, the second temperature, and the third temperature is selected to not adversely affect the niobium by damaging the niobium.

16. The method of claim 15, wherein the forming the second niobium layer further comprises depositing and patterning niobium to form the second set of the patterned niobium traces and at least one niobium via for connecting at least one of the second set of the patterned niobium traces with at least one of the first set of the patterned niobium traces.

17. The method of claim 15, wherein each of the first set of the patterned niobium traces and the second set of the patterned niobium traces is formed using lithography.

18. The method of claim 15, wherein the second temperature is lower than the first temperature by at least 25 degrees Centigrade and the third temperature is lower than the second temperature by at least 25 degrees Centigrade.

19. The method of claim 15 further comprising forming at least one via in the second dielectric layer, wherein the via comprises niobium.

20. The method of claim 19, wherein the at least one via is formed in a same step as the forming the second niobium layer, and wherein the at least one via is formed by conformal deposition of the niobium.

* * * * *